US012025921B2

(12) United States Patent
Kim et al.

(10) Patent No.: US 12,025,921 B2
(45) Date of Patent: Jul. 2, 2024

(54) COOLING UNIT, SUBSTRATE TREATING APPARATUS INCLUDING THE SAME, AND SUBSTRATE TREATING METHOD USING THE SAME

(71) Applicant: SEMES CO., LTD., Cheonan-si (KR)

(72) Inventors: Jun Ho Kim, Seongnam-si (KR); Sang Hoon Lee, Suwon-si (KR); Jong Seok Seo, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 358 days.

(21) Appl. No.: 17/487,170

(22) Filed: Sep. 28, 2021

(65) Prior Publication Data

US 2022/0100096 A1 Mar. 31, 2022

(30) Foreign Application Priority Data

Sep. 29, 2020 (KR) .......................... 10-2020-0127273

(51) Int. Cl.
*G03F 7/40* (2006.01)

(52) U.S. Cl.
CPC ..................... *G03F 7/40* (2013.01)

(58) Field of Classification Search
CPC ............... H01L 21/6718; H01L 2/6838; H01L 21/67103; H01L 21/67109; H01L 21/6719; H01L 21/67742; H01L 21/67748; H01L 21/68742; H01L 21/6875; H01L 21/68785; G03F 7/40; G03F 7/168; G03F 7/38
See application file for complete search history.

(56) References Cited

U.S. PATENT DOCUMENTS

2003/0000775 A1* 1/2003 Yudovsky ......... H01L 21/67748
187/250
2020/0075389 A1* 3/2020 Tian .................. H01L 21/67259

FOREIGN PATENT DOCUMENTS

| KR | 10-2008-0018455 A | 2/2008 |
| KR | 10-2012-0036258 A | 4/2012 |
| KR | 101336487 B1 | 12/2013 |
| KR | 10-2016-0017699 A | 2/2016 |
| KR | 102188354 B1 | 12/2020 |

OTHER PUBLICATIONS

Korean Office Action dated Oct. 27, 2022 for corresponding Korean Application No. 10- 2020-0127273.

* cited by examiner

*Primary Examiner* — Henry T Crenshaw
*Assistant Examiner* — Kamran Tavakoldavani
(74) *Attorney, Agent, or Firm* — Harness, Dickey & Pierce, P.L.C.

(57) ABSTRACT

The inventive concept provides a cooling unit. In an embodiment, the cooling unit comprises: a cooling plate with a seating surface; a pin member arranged at the cooling plate and supporting a substrate; a decompression hole formed on the seating surface; a decompression path formed within the cooling plate and connected to the decompression hole; a decompression member for decompressing the decompression path; and a controller for controlling the decompression member, wherein the controller controls the decompression member to decompress a space between the substrate and the seating surface of the cooling plate and thereby adjusting a distance between the substrate and the seating surface of the cooling plate.

17 Claims, 11 Drawing Sheets

COOLING UNIT, SUBSTRATE TREATING APPARATUS INCLUDING THE SAME, AND SUBSTRATE TREATING METHOD USING THE SAME

CROSS-REFERENCE TO RELATED APPLICATIONS

A claim for priority under 35 U.S.C. § 119 is made to Korean Patent Application No. 10-2020-0127273 filed on Sep. 29, 2020, in the Korean Intellectual Property Office, the entire contents of which are hereby incorporated by reference.

BACKGROUND

Embodiments of the inventive concept described herein relate to a substrate treating apparatus including a cooling unit and a substrate treating method using the same, and more specifically, to a substrate treating apparatus comprising a cooling unit provided within a bake unit and a substrate treating method for cooling a substrate after heating the substrate.

In general, various processes such as cleaning, deposition, photolithography, etching, and ion implantation, and the like, are performed to manufacture semiconductor devices. The photolithography process for forming a pattern plays an important role in achieving high-intensity integration of the semiconductor devices.

The photolithography process includes forming a photoresist pattern on a semiconductor substrate. The photoresist pattern may be formed by processes including a coating process that forms a photoresist layer on the substrate, an exposing process that exposes the photoresist layer using a photomask to a light source, and a developing process that develops the exposed photoresist layer to remove selectively portions of the exposed photoresist layer and to form a photoresist pattern, and a baking process that heats and cools the substrate before and after each process is performed.

The baking process heats the substrate through a heating unit. The heating unit has a heating plate on which the substrate is placed. After the treatment of substrates in one group have been completed, and before the treatment of substrates in another group is initiated, the temperature of the heating plate should be adjusted to be appropriate for the treatment conditions of the substrates (i.e., heating temperature) belonging to another group. Increasing the temperature of the heating plate can be swiftly performed by increasing the heat energy provided to the heating plate. However, lowering the temperature of the heating plate takes a long time because it is conducted through a natural cooling process. The required time for the natural cooling process causes a decrease in operation capacity.

On the other hand, the substrate heated at the heating unit is cooled in the cooling unit of a baking apparatus before it is taken out of the baking apparatus. The cooling unit has a cooling plate on which the substrate is placed. A cooling path is provided inside the cooling plate. If the distance between the substrate and the cooling plate is not close enough, the heat transfer between substrate and the cooling plate may not be enough to sufficiently cool the substrate. If the distance between the substrate and the cooling plate is too close, a rapid decrease in temperature may cause the substrate to crack due to a thermal shock.

SUMMARY

Embodiments of the inventive concept provide a cooling unit, and substrate treating apparatus and method including the same which is capable of increasing cooling speed.

Embodiments of the inventive concept also provide a cooling unit and substrate treating apparatus and method including the same which is capable of preventing damage of the substrate due to thermal shock.

The technical objectives of the inventive concept are not limited to the above-mentioned ones, and the other unmentioned technical objects will become apparent to those skilled in the art from the following description.

The inventive concept provides a cooling unit. In an embodiment, the cooling unit for cooling a substrate comprises a cooling plate with a seating surface; a pin member arranged at the cooling plate and supporting a substrate; a decompression hole formed on the seating surface; a decompression path formed within the cooling plate and connected to the decompression hole; a decompression member for decompressing the decompression path; and a controller for controlling the decompression member, wherein the controller controls the decompression member to decompress a space between the substrate and the seating surface of the cooling plate and thereby adjusting a distance between the substrate and the seating surface of the cooling plate.

In an embodiment, a cooling path is provided within the cooling plate.

In an embodiment, the pin member comprises a proximity pin supporting the substrate and an elastic member connected to the proximity pin.

In an embodiment, the elastic member is constricted by a decompression force by the decompression member and is not constricted by the load of the substrate supported by the proximity pin.

In an embodiment, the controller controls the decompression member to adjust the distance between the substrate and the seating surface of the cooling plate such that the cooling plate cools the substrate at the first distance between the substrate and the seating surface of the cooling plate and then cools the substrate at the second distance between the substrate and the seating surface of the cooling plate, the second distance is shorter than the first distance.

In an embodiment, the proximity pin is disposed in an insertion groove formed on the seating surface.

The inventive concept provides a substrate treating apparatus. In an embodiment, the apparatus comprises a housing, a heating unit positioned within the housing and having a heating plate for heating a substrate, and a cooling unit for cooling the heating plate and/or the substrate, wherein the cooling unit comprises a cooling plate with a seating surface, a pin member arranged at the cooling plate and supporting the substrate, a decompression hole formed on the seating surface, a decompression path formed within the cooling plate and connected to the decompression hole, a decompression member for decompressing the decompression path, and a driving member for moving the cooling plate within the housing, between a position over the heating plate and a position out of the position over the heating plate.

In an embodiment, the cooling plate is provided with a cooling path therein.

In an embodiment, the pin member comprises a proximity pin for supporting the substrate, and an elastic member connected to the proximity pin.

In an embodiment, the elastic member is decompressed by a decompression force by the decompression member and is not constricted by the load of the substrate supported by the proximity pin.

In an embodiment, the proximity pin is arranged within an insertion groove formed on the seating surface of the cooling plate.

In an embodiment, the heating unit is provided to move vertically within a pinhole formed at the heating plate, and the heating plate further comprises a lift pin for delivering the substrate to the cooling unit.

In an embodiment, the cooling plate is provided with a guide hole for delivering the substrate to the heating unit, and when the cooling plate is moved to the second position the lift pin is inserted into the guide hole of the cooling plate to take over and support the substrate, and wherein the guide hole extends outwardly to an edge of the cooling pin.

In an embodiment, a controller controls the cooling unit such that the cooling plate is placed in contact with or adjacent to the heating plate to cool the cooling plate.

In an embodiment, the controller controls the cooling unit such that the substrate is delivered to the cooling plate from the heating plate, then the substrate supported by the cooling plate is cooled, and then a space between the substrate and the seating surface of the cooling plate is decompressed by the decompression member to lower down the substrate toward the seating surface.

In an embodiment, the controller further controls the cooling unit such that the substrate is cooled further when the substrate is lowered down toward the seating surface by the decompression member.

Embodiments of the inventive concept provide a substrate treating method. The method comprises cooling a substrate with a cooling unit after the substrate is heat treated in a heating plate, and wherein the cooling a substrate with a cooling unit comprises placing the substrate over a cooling plate of the cooling unit and cooling the substrate, and decompressing a space between the substrate and the seating surface of the cooling plate to lower down the substrate to the seating surface.

In an embodiment, the cooling a substrate with a cooling unit further comprises cooling the substrate at the second height, the second height being lower than the first height.

In an embodiment, placing the substrate over a cooling plate of the cooling unit comprises supporting the substrate with a pin member arranged in an insertion groove of the cooling plate, the pin member comprising a proximity pin supporting the substrate and an elastic member connected to the proximity pin, wherein the decompressing a space between the substrate and the seating surface of the cooling plate to lower down the substrate to the seating surface comprises decompressing a decompression path formed within the cooling plate and a decompression hole formed on the seating surface and connected to the decompression path, and wherein decompressing the space between the substrate and the seating surface of the cooling plate compresses the elastic member thereby lowering the substrate toward the seating surface of the cooling plate.

Embodiments of the inventive concept increase the cooling speed of the cooling unit.

Embodiments of the inventive concept prevent substrate damaging caused by thermal shock.

The effects of the inventive concept are not limited to the above-described effects, and the effects not mentioned will be clearly understood by those of ordinary skill in the technical field to which the inventive concept belongs from this specification and the accompanying drawings.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
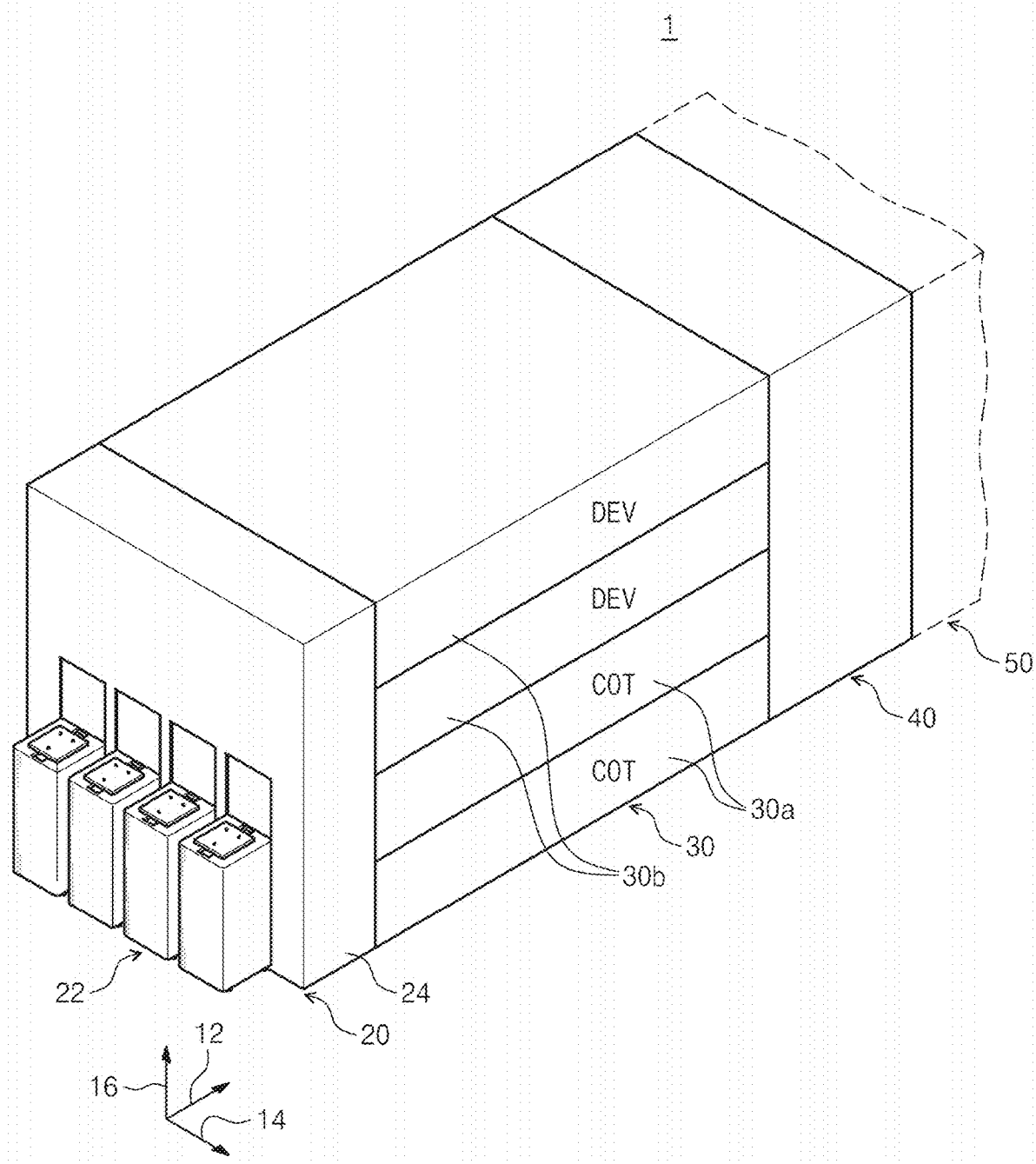
FIG. 1 is a schematic perspective view illustrating a substrate treating apparatus according to an embodiment of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Figure 2:
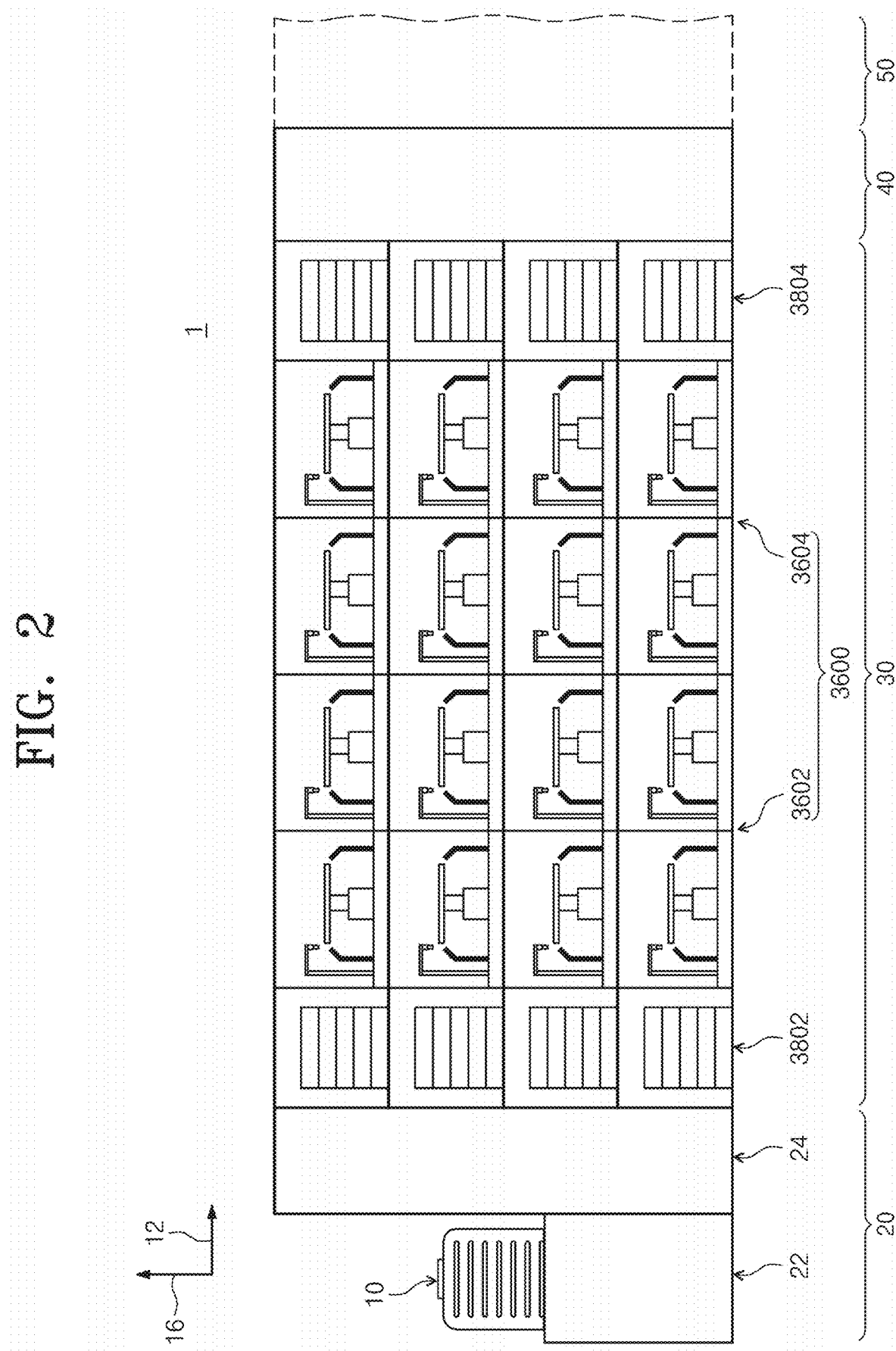
FIG. 2 is cross sectional view of a substrate treating apparatus illustrating a coating block and a developing block of FIG. 1.
Figure 3:
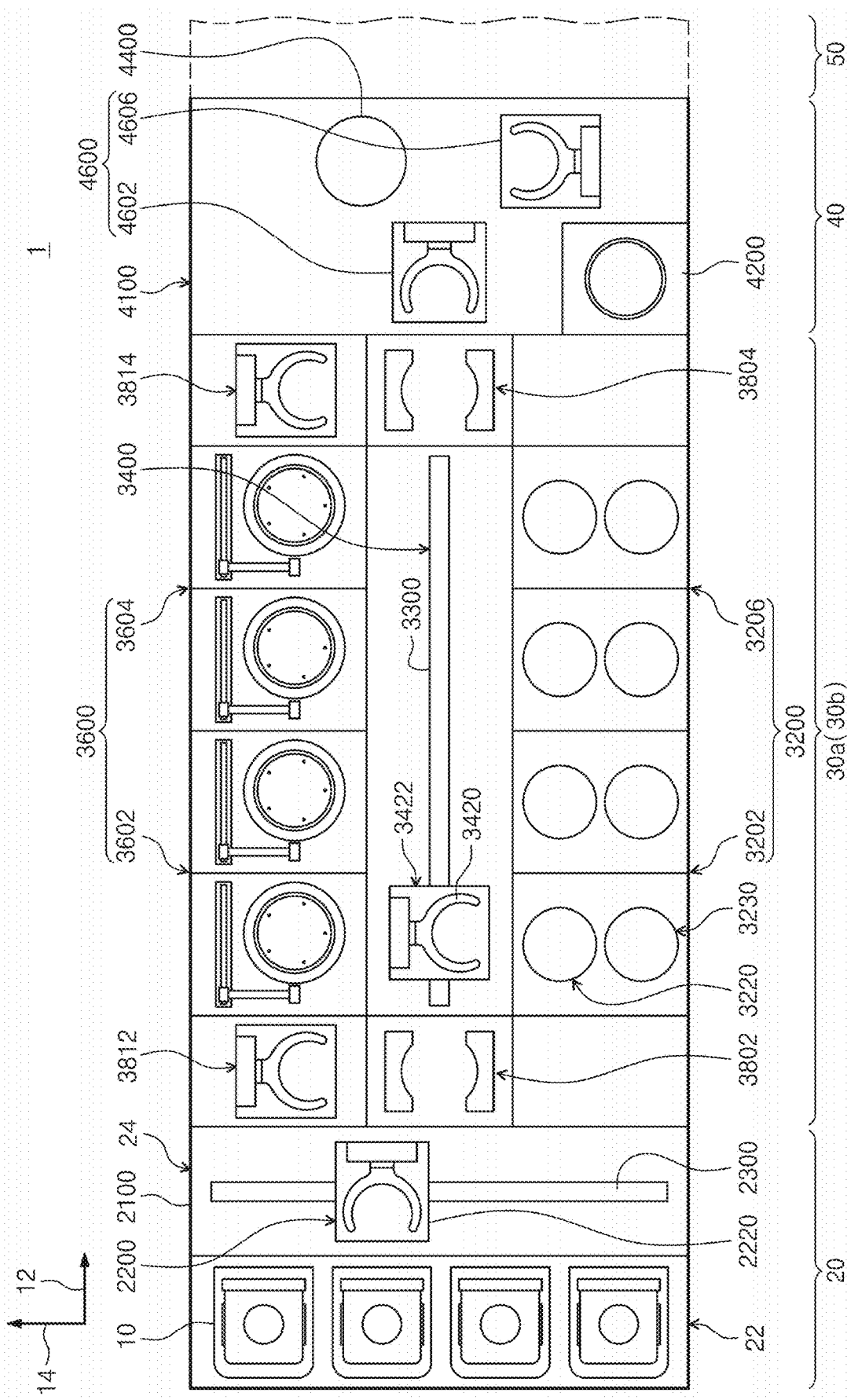
FIG. 3 is a top plan view illustrating a substrate treating apparatus of FIG. 1.

FIG. 1 is a schematic perspective view illustrating a substrate treating apparatus of the inventive concept. FIG. 2 is a sectional view illustrating coating blocks and developing blocks of the substrate treating apparatus of FIG. 1. FIG. 3 is a plan view illustrating the substrate treating apparatus of FIG. 1.

Referring to FIGS. 1 to 3, the substrate treating apparatus 1 includes an index module 20, a treating module 30, and an interface module 40. According to an embodiment, the index module 20, the treating module 30, and the interface module 40 are sequentially disposed in a row. Hereinafter, a direction in which the index module 20, the treating module 30, and the interface module 40 are arranged is referred to as a first direction 12, a direction perpendicular to the first direction 12 when viewed from above is referred to as a second direction 14, and a direction perpendicular to both the first direction 12 and the second direction 14 is referred to as a third direction 16.

The index module 20 transfers substrates W from carriers 10, in which the substrates W are received, to the treating module 30 and transfers the completely treated substrates W in the treating module 30 to the carriers 10. The lengthwise direction of the index module 20 is parallel to the second direction 14. The index module 20 may have a load port 22 on which the carriers 10 having the substrates W received therein are placed. Furthermore, the index module 20 has an index frame 24. The load port 22 are located on the opposite to the treating module 30 with disposing the index frame 24 therebetween. The carriers 10 having the substrates W received therein are placed on the load port 22. The load port 22 may be provided in plural and the plural load ports 22 may be disposed along the second direction 14.

Airtight carriers 10 such as front open unified pods (FOUPs) may be used as the carriers 10. The carriers 10 may be placed on the load ports 22 by a transfer means (not shown) such as an overhead transfer, an overhead conveyor, or an automatic guided vehicle, or by an operator.

An index robot 2200 is provided in the index frame 24. A guide rail 2300, the lengthwise direction of which is parallel to the second direction 14, is provided in the index frame 24. The index robot 2200 is movable on the guide rail 2300. The index robot 2200 includes a hand 2220 on which the substrate W is placed, and the hand 2220 is movable forward and backward, rotatable about the third direction 16 as an axis, and movable along the third direction 16.

The treating module 30 performs a coating process and a developing process on the substrates W. The treating module 30 has a coating block 30a and a developing block 30b. The coating block 30a performs the coating process on the substrates W, and the developing block 30b perform the developing process on the substrates W. The coating block 30a are provided in plural and the plural coating blocks 30a are stacked on each other. The developing block 30b are provided in plural and the plural developing blocks 30b are stacked on each other.

According to the embodiment of FIG. 1, two coating blocks 30a and two developing block 30b are provided. The coating blocks 30a may be disposed under the developing blocks 30b. According to an embodiment, the two coating blocks 30a may perform the same process and may have the same structure. Furthermore, the two developing blocks 30b may perform the same process and may have the same structure.

Referring to FIG. 3, the coating blocks 30a have a heat treating chamber 3200, a transfer chamber 3400, a liquid treating chamber 3600, and a buffer chamber 3800. The heat treating chamber 3200 performs a heat treatment process on the substrate W. The heat treatment process may include a cooling process and a heating process. The liquid treating chamber 3600 forms a liquid film on the substrate W by dispensing a liquid onto the substrate W. The liquid film may be a photoresist film or an anti-reflection film. The transfer chamber 3400 transfers the substrate W between the heat treating chamber 3200 and the liquid treating chamber 3600 in the coating blocks 30a.

The transfer chamber 3400 is disposed such that the lengthwise direction thereof is parallel to the first direction 12. A transfer robot 3422 is provided in the transfer chamber 3400. The transfer robot 3422 transfers the substrate W between the heat treating chamber 3200, the liquid treating chamber 3600, and the buffer chamber 3800. According to an embodiment, the transfer robot 3420 has a hand 3420 on which the substrate W is placed, and the hand 3420 is movable forward and backward, rotatable about the third direction 16 as an axis, and movable along the third direction 16. A guide rail 3300, the lengthwise direction of which is parallel to the first direction 12, is provided in the transfer chamber 3400. The transfer robot 3422 is movable on the guide rail 3300.

The liquid treating chamber 3600 is provided in plural. Some of the liquid treating chambers 3600 may be stacked on each other. The liquid treating chambers 3600 are placed on one side of the transfer chamber 3402. The liquid treating chambers 3600 are arranged along the first direction 12. Some of the liquid treating chambers 3600 are provided adjacent to the index module 20. Hereinafter, the liquid treating chambers 3600 provided adjacent to the index module 20 are referred to as front liquid treating chambers 3602. Some of the liquid treating chambers 3600 are provided adjacent to the interface module 40. Hereinafter, the liquid treating chambers 3600 provided adjacent to the interface module 40 are referred to as rear heat treating chambers 3604.

The front liquid treating chamber 3602 applies a first liquid on the substrate W, and the second liquid treating chamber 3604 applies a second liquid on the substrate W. The first liquid and the second liquid may be different types of liquids. According to an embodiment, the first liquid is a suitable liquid for forming an anti-reflection layer and the second liquid is a photoresist for forming a photoresist layer. The photoresist may be applied on the substrate W having an applied anti-reflection layer. Alternatively, the first liquid may be a photoresist and the second liquid may be a suitable liquid for forming the anti-reflection layer. In this case, the liquid for forming a anti-reflective layer may be applied on the substrate W having a photoresist layer. Alternatively, the first liquid and the second liquid may be the same kind of liquids, and they can all be photoresists.

The buffer chamber 3800 is provided in plural. Some of the buffer chambers 3800 are placed between the index module 20 and the transfer chamber 3400. Hereinafter, these buffer chambers are referred to as front buffers 3802. The plurality of front buffers 3802 are stacked on each other along the vertical direction. Some of the buffer chambers 3800 are placed between the transfer chamber 3400 and the interface module 40. These buffer chambers are referred to as rear buffers 3804. The plurality of rear buffers 3804 are stacked on each other along the vertical direction. Each of the front buffers 3802 and rear buffers 3804 temporarily hold a plurality of substrates W. The substrates W stored in the front buffer 3802 are brought in or out by the index robot 2200 and the transfer robot 3422. The substrates W stored in the rear buffer 3804 are brought in or out by the transfer robot 3422 and the first robot 4602.

The developing block 30b has a heat treating chamber 3200, a transfer chamber 3400, and a liquid treating chamber

3600. The heat treating chamber 3200, the transfer chamber 3400, and the liquid treating chamber 3600 of the developing block 30b are provided in a configuration and an arrangement largely similar to the heat treating chamber 3200, the transfer chamber 3400, and the liquid treating chamber 3600 of the coating block 30a. However, all of the liquid treating chambers 3600 in the developing block 30b provide developing liquid, and are provided as developing chambers 3600 which develop the substrates W.

The interface module 40 connects the processing module 30 with an external exposing apparatus 50. The interface module 40 has an interface frame 4100, an additional processing chamber 4200, an interface buffer 4400, and a transfer member 4600.

The top end of the interface frame 4100 may be provided with a fan filter unit that generates a descent airflow inside. The additional processing chamber 4200, the interface buffer 4400, and the transfer member 4600 are placed inside the interface frame 4100. Before the substrate W which has completed processing in the coating block 30a is brought into the exposing apparatus 50, the additional processing chamber 4200 may perform a certain additional processing. Alternatively and/or additionally, the additional processing chamber 4200 may perform a certain additional processing before the substrate W which has completed processing in the exposing apparatus 50 is brought into the developing block 30b. For example, the additional processing may be an edge exposing process that exposes the edge area of the substrate W, and/or a top surface cleaning process that cleans the top surface of the substrate W, and/or a bottom surface cleaning process that cleans the bottom surface of the substrate W. A plurality of additional processing chambers 4200 may be provided, and they may be stacked on each other. The additional processing chambers 4200 may all be provided to perform the same processing. Alternatively, some of the additional processing chambers 4200 may be provided to perform different processings.

The interface buffer 4400 provides a space for the substrate W to temporarily stay during the transferring between the coating block 30a, the additional processing chambers 4200, the exposing apparatus 50, and the developing block 30b. The interface buffer 4400 can be provided in plural, and the plurality of interface buffers 4400 can be stacked on each other.

For example, the additional process chamber 4200 is placed at one side of a line of the length of the transfer chamber 3400, and the interface buffer 4400 may be placed at the other side of a line of the length of the transfer chamber 3400.

The transfer member 4600 transfers the substrate W between the coating block 30a, the additional processing chamber 4200, the exposing device 50, and the developing block 30b. The transfer member 4600 can be provided as a singular robot or in a plurality of robots. For example, the transfer member 4600 has a first robot 4602 and a second robot 4606. The first robot 4602 may transfer the substrate W between the coating block 30a, the additional processing chamber 4200, and the interface buffer 440, the interface robot 4604 may transfer the substrate W between the interface buffer 4400 and the exposing device 50, and the second robot 4604 may transfer the substrate W between the interface buffer 4400 and the developing block 30b.

The first robot 4602 and the second robot 4606 each include a hand on which the substrate W is placed, the hand 122 can be provided forwardly and backwardly movable, rotatable about the third direction 16 as an axis, and movable along the third direction 16.

The hands of the index robot 2200, the first robot 4602, and the second robot 4606 can all be provided in the same shape as the hands 3420 of the transfer robot 3422 and 3424. Alternatively, the hand of a robot that sends and receives the substrate W directly from the transfer plate 3240 of the heat treating chamber may be provided in the same shape as the hand of the transfer robot 3422 and 3424, while the hands of the remaining robots may be provided in a different shape.

According to an embodiment, the index robot 2200 is provided to send and receive the substrate W directly with the heating unit 3230 of the front heat treating chamber 3200 provided in the coating block 30a.

In addition, the transfer robot 3422 provided in the coating block 30a and the developing block 30b may be provided to directly send and receive the substrate W from the transfer plate 3240 placed in the heat treating chamber 3200.

Figure 4:
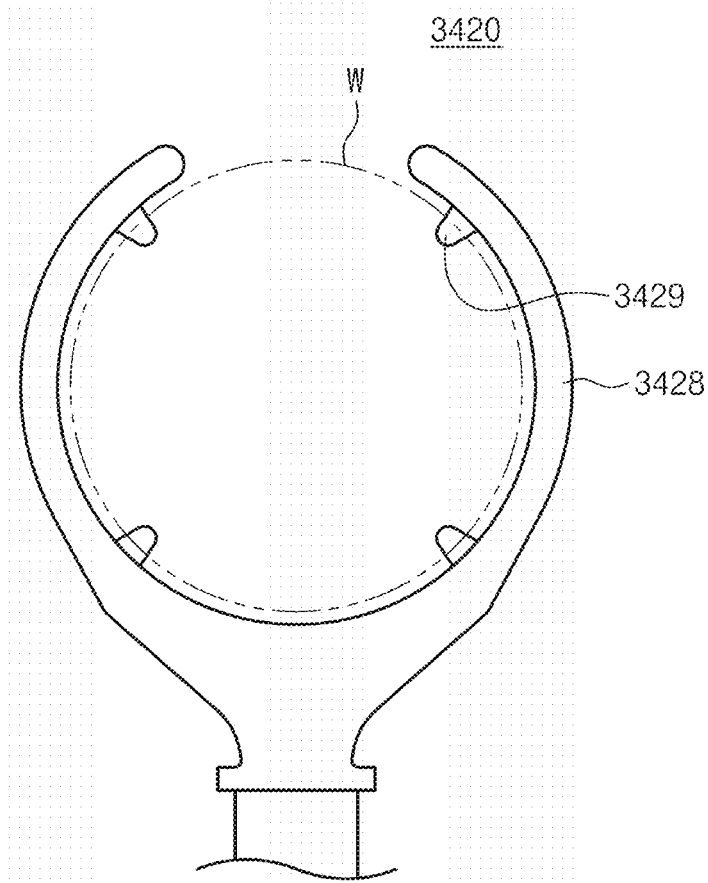
FIG. 4 is a view illustrating an embodiment of a transfer robot hand of FIG. 3.

FIG. 4 shows an embodiment of the hand of the transfer robot in FIG. 3. Referring to FIG. 4, the hand 3420 has a base 3428 and a support protrusion 3429. The base 3428 may have an annular ring shape with a portion of the circumference cut away. The base 3428 has an inner diameter greater than the diameter of the substrate W. The support protrusion 3429 extends inwardly from the base 3428. The support protrusion 3429 is provided in plural and the support protrusions 3429 support the edge area of the substrate W. For example, four support protrusions 3429 may be provided at equal intervals.

Teat treating chamber 3200 is provided in plural. The heat treating chambers 3200 are arranged along the first direction 12. The heat treating chambers 3200 are placed on one side of the transfer chamber 3400.

Figure 5:
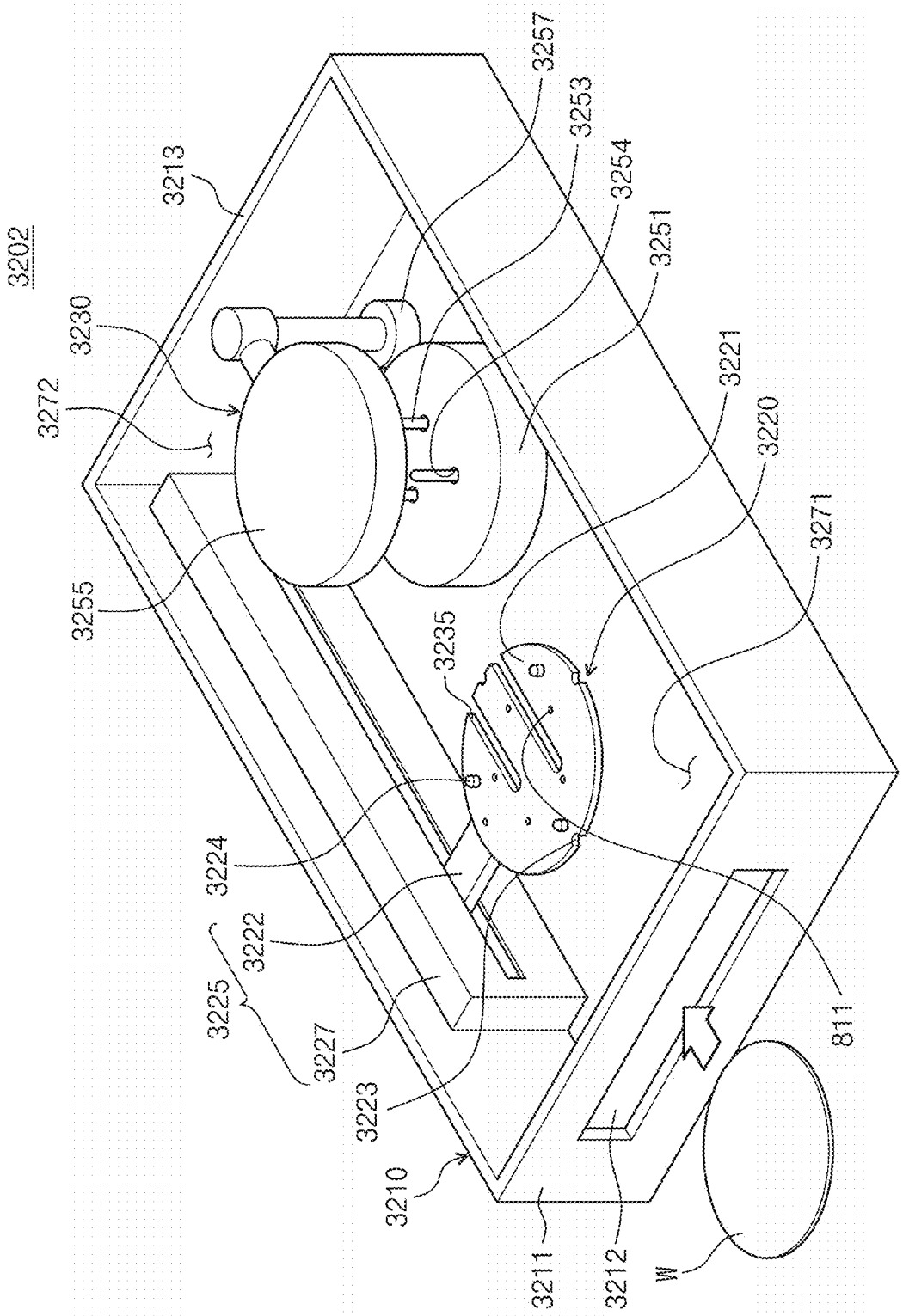
FIG. 5 is a perspective view illustrating a heat treating chamber of FIG. 3.
Figure 6:
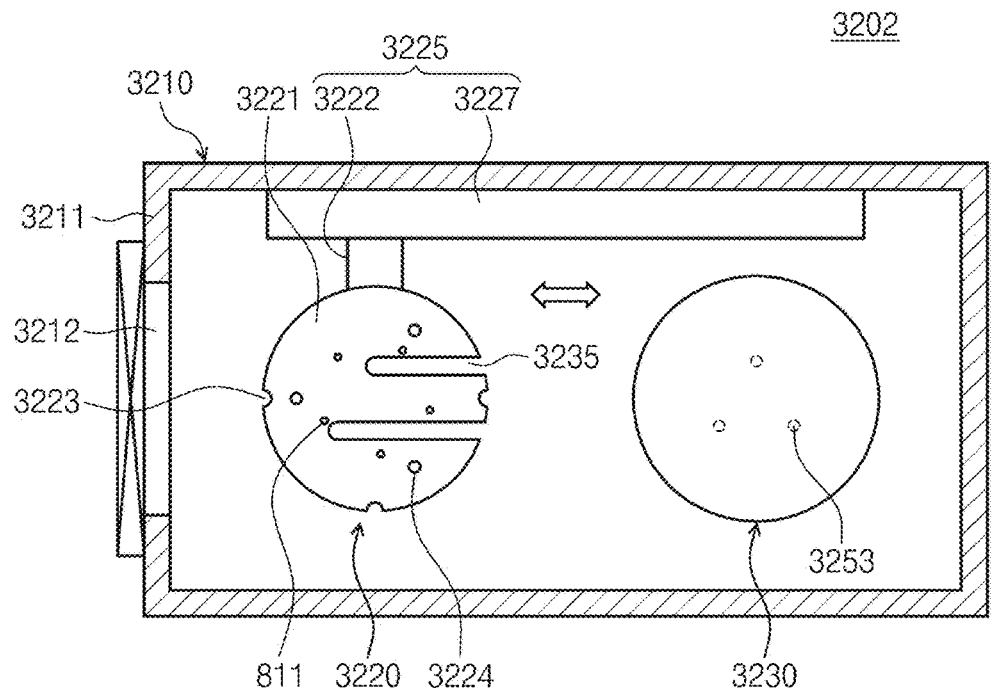
FIG. 6 is a top plan view illustrating a heat treating chamber of FIG. 3.
Figure 7:
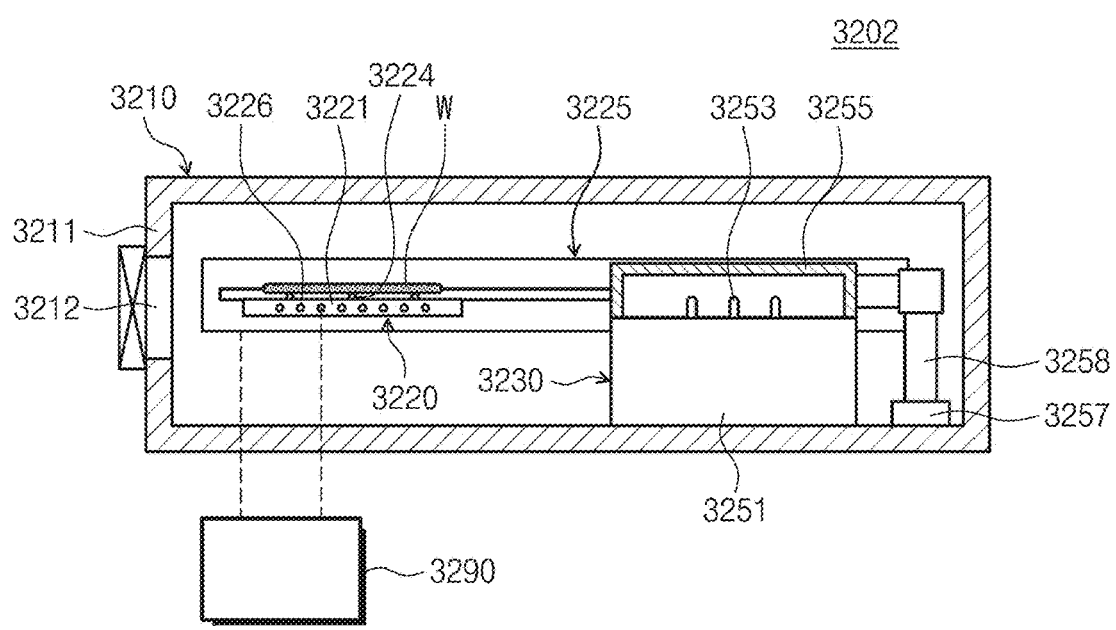
FIG. 7 is a front view illustrating a heat treating chamber of FIG. 3.

FIG. 5 is a perspective view of the heat treating chamber 3202 in FIG. 3, FIG. 6 is a plan view of the heat treating chamber 3202 in FIG. 3, and FIG. 7 is a front view of the heat treating chamber 3202 in FIG. 3. Referring to FIG. 5 to FIG. 7, the heat treating chamber 3202 heats the substrate W. For example, the heat treating chamber 3202 performs heating process such as a pre-bake process of removing organic matter or moisture from the surface of substrate W by heating the substrate W to a certain temperature before applying the photoresist to, a soft-bake process performed after coating photoresist on the substrate W, or other heating processes, and a cooling process for cooling the substrate W after each heating process is performed. The heating unit 3230 provided in some of the heat treating chambers 3202 may supply gas during substrate W heating to improve the adhesion of the photoresist to the substrate W. For example, the gas may be a hexamethyldisilane gas.

The heat treating chamber 3202 includes a housing 3210, a heating unit 3230, a cooling unit 3220, and a controller 590. The controller 590 controls the cooling unit 3220 to perform the substrate treating method described below. The cooling units 3220 and heating units 3230 are provided along the second direction 14. For example, the cooling unit 3220 may be placed closer to the transfer chamber 3400 than the heating unit 3230.

The housing 3210 provides an inner space for the baking process. The housing 3210 is provided in a rectangular parallelepiped shape. The housing 3210 includes a first sidewall 3211, a second sidewall 3213, and an entrance 3212.

The first sidewall 3211 is provided on one side of the housing 3210. The second sidewall 3213 is provided opposite the first sidewall 3211. On the sidewall of the housing 3210, an entrance 3212 through which the substrate W enters and exits is formed. In one example, the entrance 3212 may be formed on the first sidewall 3211. The entrance 3212 provides a passageway through which the substrate W travels. In one example, the heating unit 3230 is provided closer to the second sidewall 3213 than the first sidewall 3211.

The heating unit 3230 heats the substrate W to a set temperature. The heating unit 3230 is provided to heat the substrate W to a temperature higher than room temperature. In one example, the heating unit 3230 heats the substrate W under an atmospheric pressure or a pressure lower than the atmospheric pressure. The heating unit 3230 includes a heating plate 3251, a lift pin 3253, a cover 3255 and a driver 3257.

The inside of the heating plate 3251 is provided with a heating means for heating the substrate W. For example, the heating means may be heating coils. Alternatively and/or additionally, the heating plate 3251 may be provided with heating patterns where hot-wires are formed in a certain pattern. The heating plate 3251 is provided in a cylindrical shape.

Inside the heating plate 3251, a pin hole 3254 is formed to accommodate the lift pin 3253. The pin hole 3254 provides the path through which the lift pin 3253 travels when the lift pin 3253 vertically moves the substrate W. The pin hole 3254 is provided to penetrate the heating plate 3251 vertically. In one example, the pin hole 3254 is provided in plural with the same distance from the center of the heating plate 3251. For example, three pin holes 3254 and three corresponding lift pins 3253 may be provided. The lift pins 3253 are moved vertically by a lift (not shown). The lift pins 3253 may seat the substrate W on the heating plate 3251. The lift pins 3253 may lift the substrate W to a position spaced apart from the heating plate 3251.

The cover 3255 is located above the heating plate 3251. The cover 3255 is provided in a cylindrical shape. The cover 3255 provides a heating space inside. The cover 3255 is moved to the top of the heating plate 3251 by the driver 3257 when the substrate W moves to the heating plate 3251 for heating. The cover 3255 is moved downward by the driver 3257 to provide a heating space and the substrate W is heated. The driver 3257 is fixedly coupled to the cover 3255 by a support unit 558. The driver 3257 vertically moves the cover 3255 for transferring or returning the substrate W to and from the heating plate 3251. For example, the driver 3257 may be provided as a cylinder.

The cooling unit 3220 cools the heating plate 3251 and/or the substrate W which has completed processing. In one example, the cooling unit 3220 is provided to transfer the substrate W within the housing 3210. The cooling unit 3220 includes a cooling plate 3221, a driving member 3225, a pin member 3224, and a decompression unit 800.

The substrate W is placed on the cooling plate 3221. The cooling plate 3221 is provided in a mostly circular shape when viewed from above. The cooling plate 3221 is provided in substantially the same size as the substrate W. The cooling plate 3221 is provided as a metal with good thermal conductivity. In one example, a cooling path or channel 3226 may be provided inside the cooling plate 3221. The cooling path is supplied with a coolant to cool the substrate W and/or the heating plate 3251.

A notch 3223 is formed at the edge of the cooling plate 3221. The notch 3223 may have a shape corresponding to the protrusion 3429 formed on the hand 3420 of the above-described transfer robots 3422 and 3424. In addition, the notch 3223 is provided as many as the protrusion 3429 formed on the hand 3420 and is formed in a position corresponding to the protrusion 3429. The substrate W is transferred between the hand 3420 and the cooling plate 3221 at a position where the hand 3420 and the cooling plate 3221 are vertically aligned. The cooling plate 3221 has a guide hole 3235. The guide hole 3235 is provided extending inwardly from the edge of the cooling plate 3221. The guide hole 3235 allows for receiving the lift pin 3253 of the heating unit 3230 when moving the cooling plate 3221 during transferring the substrate W between the cooling plate 3221 and the heating unit 3230.

The drive member 3225 includes an arm 3222 and a drive rail 3227. In one example, the arm 3222 is fixedly coupled to the cooling plate 3221. The cooling plate 3221 is mounted on the drive rail 3227. The arm 3222 is provided between the cooling plate 3221 and the drive rail 3227. The drive rail 3227 moves the cooling plate 3221. In one example, the drive rail 3227 moves the cooling plate 3221 horizontally or vertically. For example, the drive rail 3227 may move the cooling plate 3221 between a first position 3271 and a second position 3272. The first position 3271 is where the cooling plate 3221 is adjacent to the first sidewall 3211. The second position 3272 is where the cooling plate 3221 is close to the second sidewall 3213 and corresponds to a position above the heating plate 3251.

Hereinafter, the pin member 3224 and the decompression unit 800 are described with reference to FIG. 8.

Figure 8:
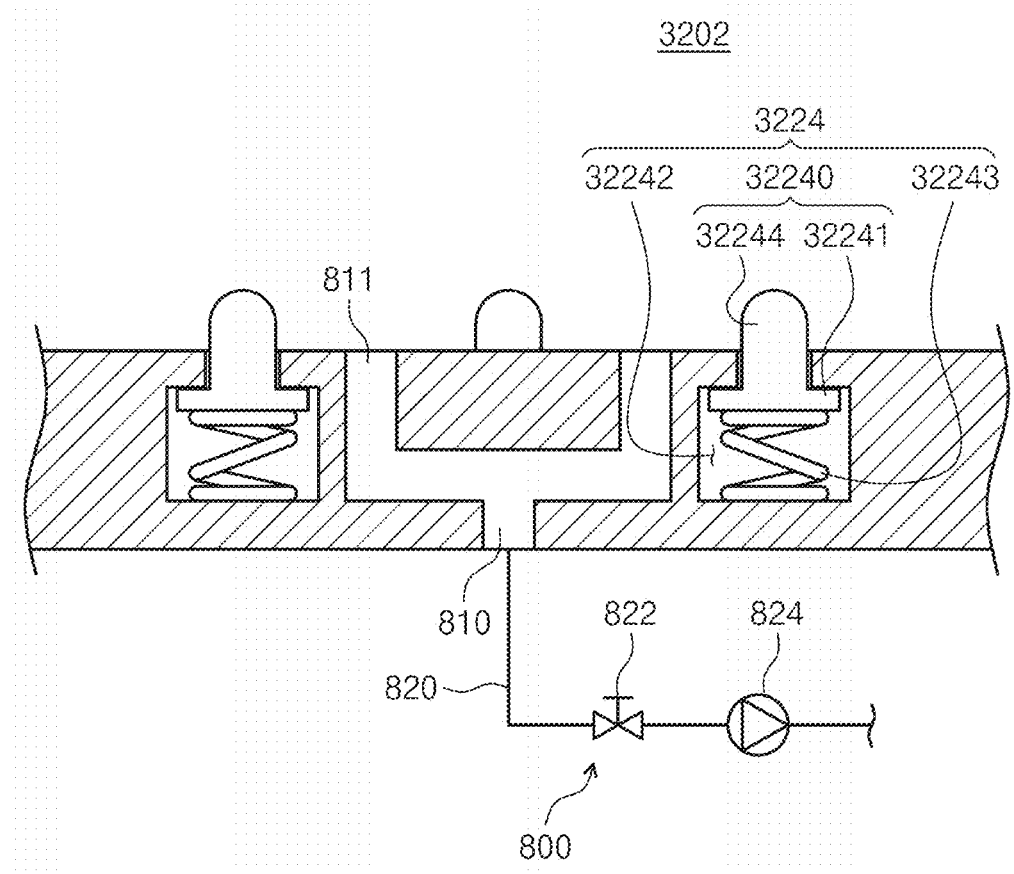
FIG. 8 is a view illustrating a cooling unit according to an embodiment of the inventive concept.

Referring to FIG. 8, the pin member 3224 includes a proximity pin 32240 and an elastic member 32243. The proximity pin 32240 is provided at the seating surface of the cooling plate 3221 to support the substrate W. In one example, the proximity pin 32240 are provided in plural. For example, three proximity pins 32240 may be provided. The proximity pins 32240 may be arranged symmetrically with respect to the center of the cooling plate 3221, e.g., with same distance from the center of the cooling plate and with space from each other. The proximity pins 32240 may be provided within respective insertion hole 32242 formed at the seating surface.

The proximity pins 32240 can be moved between a first support position or a second support position by a decompression member 824 and the elastic member 32243. In one example, the elastic member 32243 may be a spring. Here the first support position is a position where the top end of the proximity pin 32240 protrudes as much as a first height H1 above the seating surface of the cooling plate 3221, and the second support position is a position where the top end of the proximity pin 32240 is located at a second height H2 above the seating surface of the cooling plate 3221. In one example, the second height H2 is lower than the first height H1. For example, the second height H2 is a position that protrudes above the seating surface of the cooling plate 3221 as much as a height lower than the first height H1. In one example, the proximity pin 32240 may include a body 32244 and a stopper 32241. The body 32244 is provided in a pin shape and the top end of the body 32244 supports the substrate W. The stopper 32241 is connected to and provided below the body 32244. The stopper 32241 has a diameter greater than that of the body 32244. The stopper 32241 prevents the body 32244 from escaping from the insertion hole 32242.

The elastic member 32243 binds to the proximity pin 32240 to provide elastic force to the proximity pin 32240. The elastic member 32243 provides elastic force so that the proximity pin 32240 is positioned at the first support position. For example, elastic force may be adjusted to overcome the load of the substrate supported by the proximity pin 32240 such that the proximity pin 32240 may support the substrate at a constant height (e.g., at the first position)

above the seating surface of the cooling plate 3221 unless a separate force is provided on the substrate.

The decompression unit 800 provides decompression force in a space between the substrate W supported by the proximity pin 32240 and the seating surface of the cooling plate 3221. The decompression unit 800 includes a decompression hole 811, a decompression path 810, and a decompression member 824. The decompression hole 811 is formed at the seating surface and provided in plural. For example, three to seven decompression holes 811 may be provided. The decompression holes 811 are connected to the decompression path 810 formed within the cooling plate 3221. The decompression member 824 decompresses the decompression path 810. The decompression path 810 is provided with a decompression valve 822. The decompression valve 822 adjusts whether decompression by the decompression member 824 is provided to the decompression path 810. When the decompression valve 822 is opened and the decompression member 824 provides decompression to the decompression path 810, decompression force is formed in the space between the substrate W and the seating surface through the decompression hole 811. In one example, the decompression force of the decompression member 824 is provided to be greater than (e.g., to overcome) the elastic force of the elastic member 32243 which allows the proximity pin 32240 to support the substrate at a constant height, e.g., provided to constrict the elastic member 32243, thereby lowering downwardly the substrate to the cooling plate 3221. In other words, the substrate can be lowered down to the cooling plate 3221 when the decompression member 824 decompresses the decompression path 810 and the decompression force applied to the space between the substrate and the seating surface of the cooling plate 3211, and can be lifted upward when the decompression force applied to the space between the substrate and the seating surface of the cooling plate 3211 is removed and the substrate is supported by the proximity pin 32240 at a constant height defined by the elastic force of the elastic member 32243.

In one example, the decompression hole 811 is provided not to overlap with the insertion hole 32242. Thus, the decompression force is not provided to the insertion hole 32242, but to the space between the seating surface and the bottom surface of the substrate W through the decompression hole 811. If the decompression force is provided between the seating surface and the bottom surface of the substrate W, the substrate W is forced downward. In one example, the proximity pin 32240 may be lowered due to the decompression force of the decompression member 824, as the elastic force is provided lower than the decompression force.

Hereinafter, the substrate treating method of the inventive concept is described referring of FIG. 9 to FIG. 14. FIG. 9 to FIG. 14 are drawings sequentially illustrating a substrate treating method according to an embodiment of the inventive concept.

Figure 11:
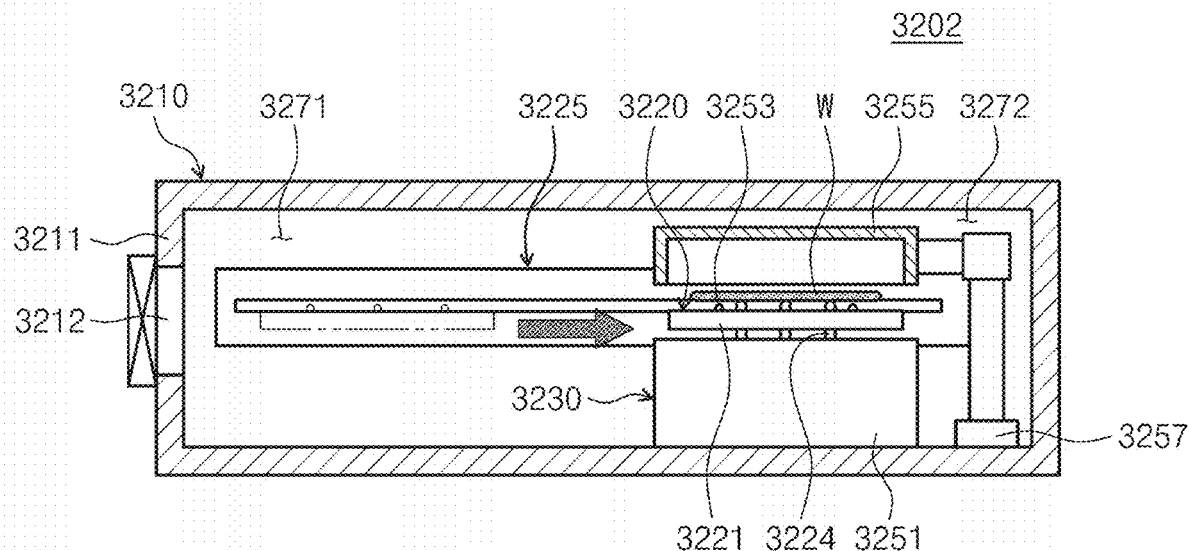

The cooling plate 3221 receives the substrate W from the above-described transfer robots 3422 and 3424 through the entrance formed at the first sidewall 3211. Then, as shown in FIG. 11, the cooling plate 3221 moves from the first position 3271 to the second position 3272 and hands over the substrate W onto the heating plate 3251. Once the substrate W is placed on the heating plate 3251, the cover 3255 is moved down the driver 3257 to cover the heating plate 3251 and the substrate W is heated to a first temperature T1 within the heating unit 3230.

Figure 9:
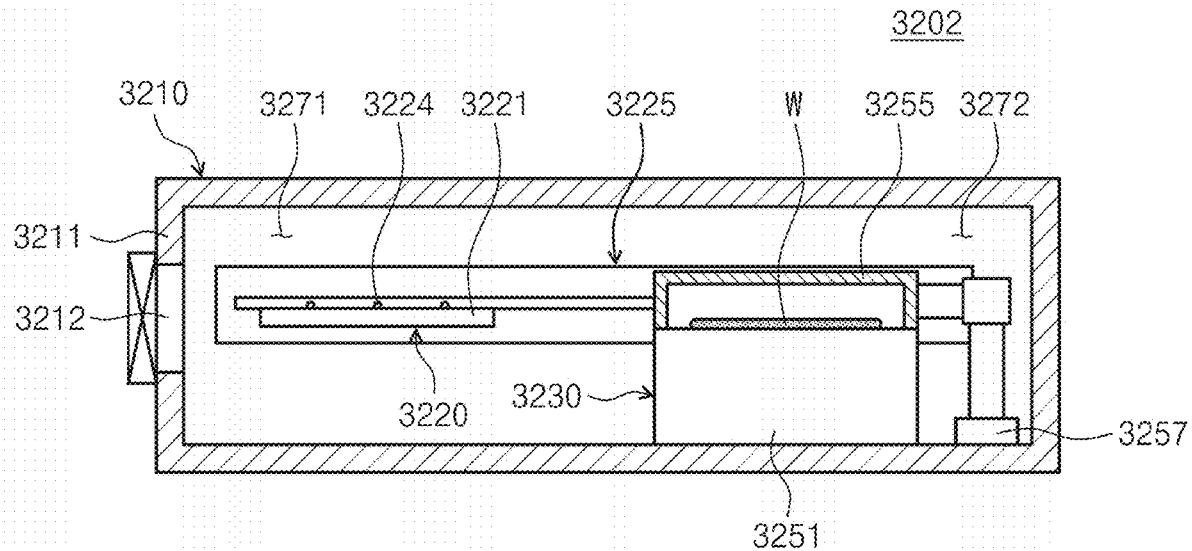
FIG. 9 to FIG. 15 are views sequentially illustrating a substrate treating apparatus according to an embodiment of the inventive concept.
Figure 10:
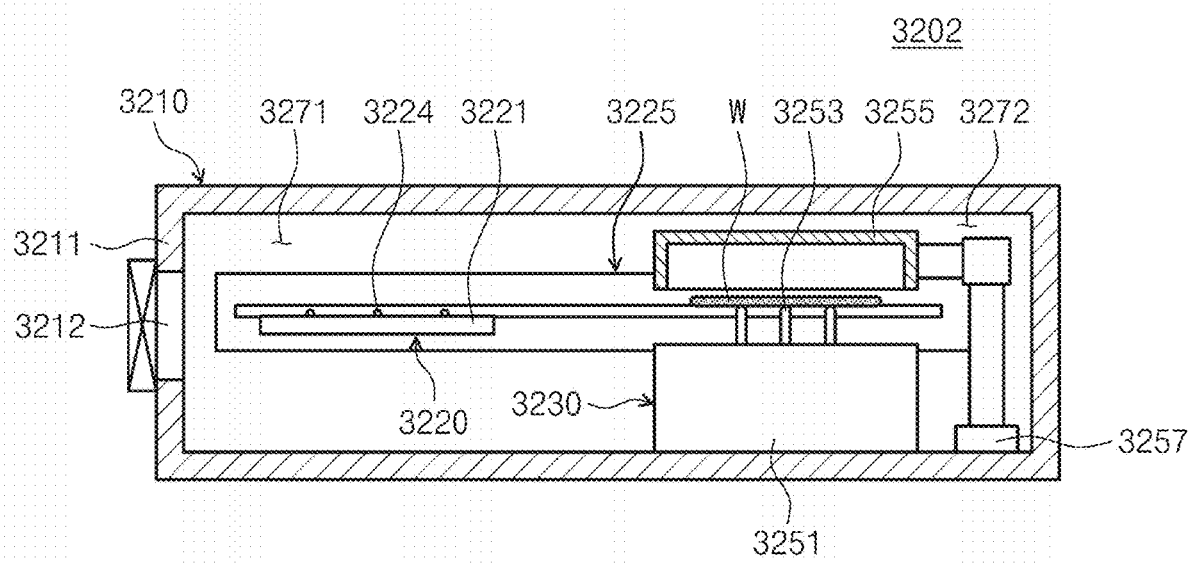

As shown in FIG. 9, after transferring the substrate to the heating plate 3252, the cooling plate 3221 may return to the first position 3271. When the heat treatment of the substrate W is completed, the cover 3255 is lifted upward by the driver 3257 as shown in FIG. 10. During or after lifting the cover 3255, the cooling plate 3221 may be moved from the first position 3271 to the second position 3272 to take over the heat treated substrate from the heating unit, as shown in FIG. 11. On the second position 3272, the substrate W is handed over from the heating plate 3251 to the cooling plate 3221.

Figure 12:
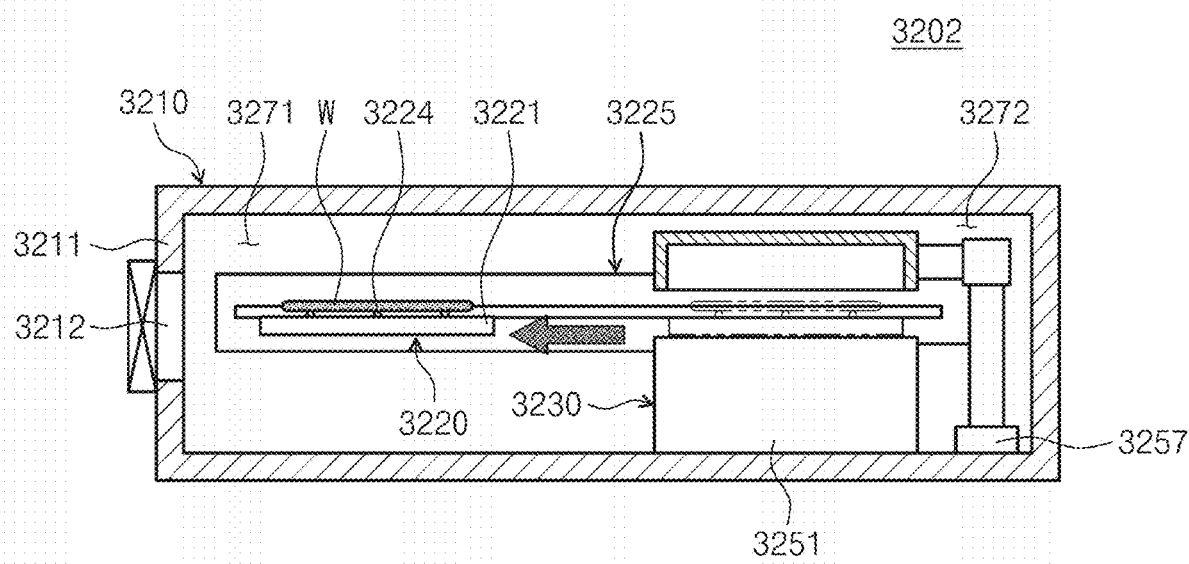

The substrate W placed on the cooling plate 3221 moves from the second position 3272 to the first position 3271, as shown in FIG. 12. The substrate W is cooled by the cooling unit 3220 during the process of moving to the first position 3271 or after moving to the first position 3271. The cooling plate 3221 is provided as a metal material that facilitates heat transfer, which increases the heat transfer efficiency between the cooling plate 3221 and the substrate W. In addition, the cooling path 3226 provided in the cooling plate 3221 increases the heat transfer efficiency between the cooling plate 3221 and the substrate W. The cooling unit lowers the temperature of the substrate W from the first temperature T1 to the second temperature T2, which is lower than the first temperature T1. In one example, no decompression is provided between the bottom of the substrate W and the seating surface while the substrate W is reaching the second temperature T2.

Figure 13:
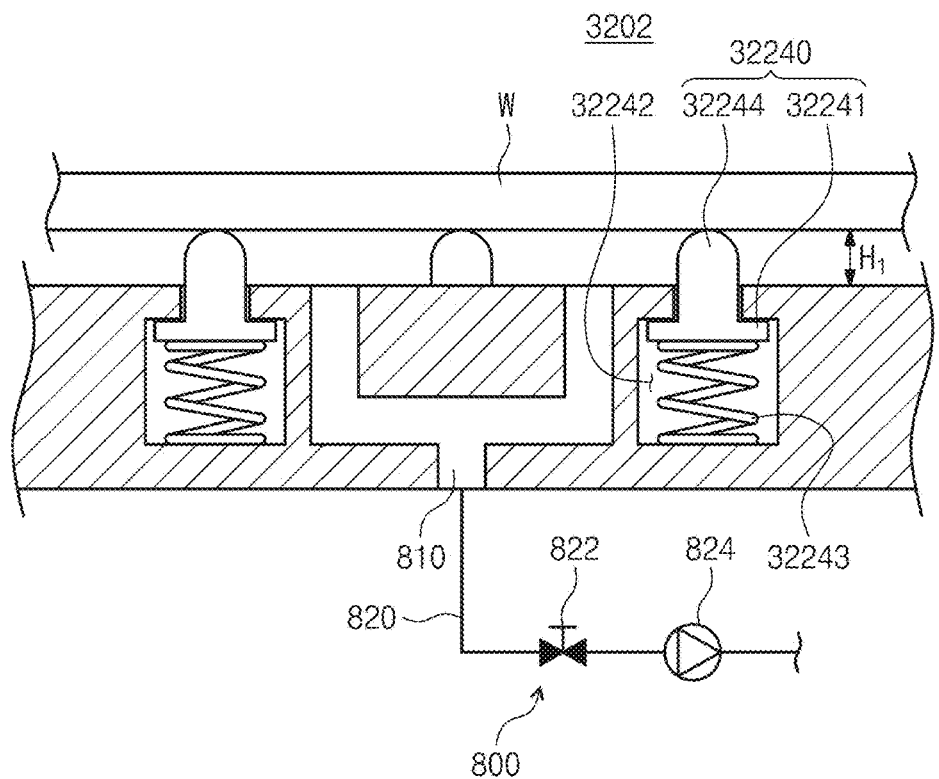

As shown in FIG. 13, while the temperature of the substrate W is reaching the second temperature T2 from the first temperature T1, the substrate W is located at the first height H1. Thus, the distance between the bottom of the substrate W and the seating surface remains H1 until the temperature of the substrate decreases to the second temperature T2 from the first temperate T1. While the temperature of the substrate W is being lowered to the second temperature T2, a distance between the substrate W and the seating surface is maintained, thereby preventing the substrate W from being damaged due to thermal shock caused by a significant decrease in temperature. In an example, a time during which the temperature of the substrate W becomes the second temperature T2 may be calculated in advance, and the calculated time may be input so that the substrate W may be placed on the cooling plate 3221 without decompression being provided (i.e., without lower the substrate down to the cooling plate) during the calculated time.

Figure 14:
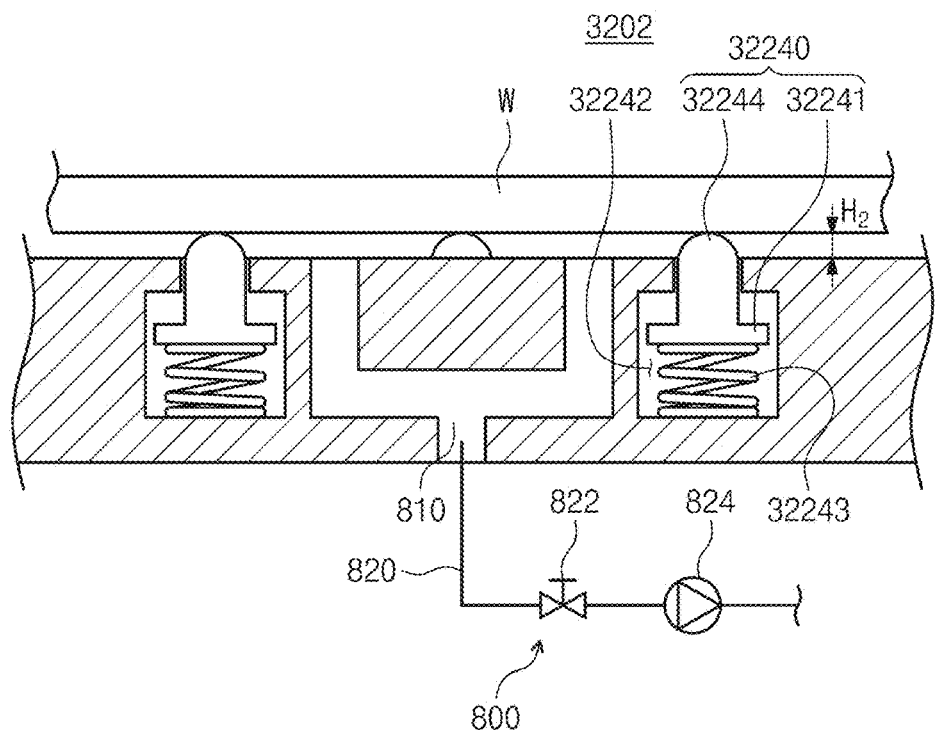

When the substrate W reaches the second temperature T2, decompression is provided by the decompression unit 800. Decompression force is provided by the decompression unit 800 between the bottom surface of the substrate W and the seating surface. Accordingly, an airflow is formed between the bottom surface of the substrate and the seating surface and convection between the substrate W and the cooling plate 3221 becomes active to help the temperature of the substrate W to drop. Furthermore, as the elastic member 32243 is provided under the proximity pin 32240, the elastic member 32243 is constricted and thus the proximity pin 32240 is lowered by the decompression force between the bottom surface of the substrate W and the seating surface. In an example, as illustrated in FIG. 14, the substrate W is positioned at the second height H2. Accordingly, the distance between the bottom surface of the substrate W and the seating surface is provided as H2. In one example, H2 is provided at a distance shorter than H1. By placing the bottom surface of the substrate W and the cooling plate 3221 close to each other at H2, heat transfer between the substrate W and the cooling plate 3221 occurs more actively than at H1. The substrate W is cooled at the second height H2 until the temperature is lowed to the third temperature T3 from the second temperature T2.

In the above-described example, it has been described that the cooling plate 3221 cools the substrate W. However, unlike this, the cooling plate 3221 may be provided to cool the heating plate 3251. For example, the cooling plate 3221 may be positioned at the second position 3272 without the substrate W being placed at either the cooling plate 3221 or the heating plate 3251. In this case, the cooling plate 3221 is disposed in contact with or adjacent to the heating plate 3251. The cooling unit lowers the temperature of the heating plate 3251 from the first temperature T1 to a temperature lower than the first temperature T1. After the heating plate 3251 is cooled, the cooling plate 3221 is moved from the second position 3272 to the first position 3271.

Figure 15:
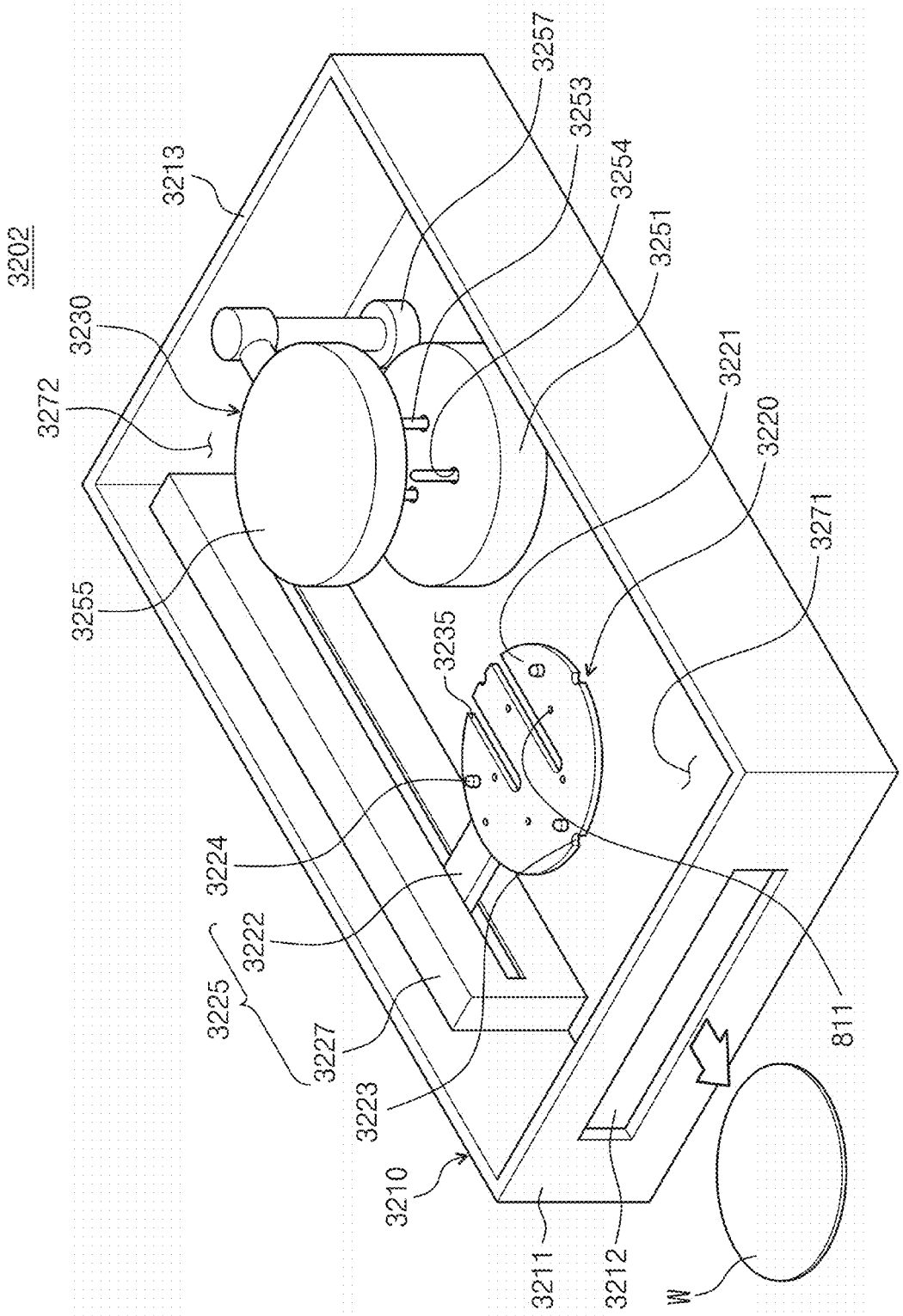

As illustrated in FIG. 15, the cooling plate 3221 transfers the substrate W to the above-described transfer robots 3422 and 3424 through the entrance formed at the first sidewall 3211.

According to exemplary embodiments, the substrate is naturally cooled at a distance spaced apart the first height H1 from the cooling plate 3221, and then decompression is provided between the substrate and the cooling plate 3221 to lower down and cool the substrate at the second height H2 which is lower than the first height H1. Accordingly, there is an advantage of preventing thermal shock applied to the substrate and increasing cooling efficiency.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A cooling unit for cooling a substrate comprising:
a cooling plate with a seating surface;
a pin member arranged at the cooling pate and supporting a substrate;
a decompression hole formed on the seating surface;
a decompression path formed within the cooling plate and connected to the decompression hole;
a decompression member for decompressing the decompression path; and
a controller for controlling the decompression member,
wherein the controller controls the decompression member to decompress a space between the substrate and the seating surface of the cooling plate and thereby adjusting a distance between the substrate and the seating surface of the cooling plate.

2. The cooling unit of claim 1, wherein a cooling path is provided within the cooling plate.

3. The cooling unit of claim 1, wherein the pin member comprises:
a proximity pin supporting the substrate; and
an elastic member connected to the proximity pin.

4. The cooling unit of claim 3, wherein the elastic member is constricted by a decompression force by the decompression member and is not constricted by the load of the substrate supported by the proximity pin.

5. The cooling unit of claim 3, wherein the controller controls the decompression member to adjust the distance between the substrate and the seating surface of the cooling plate such that the cooling plate cools the substrate at the first distance between the substrate and the seating surface of the cooling pate and then cools the substrate at the second distance between the substrate and the seating surface of the cooling pate, the second distance is shorter than the first distance.

6. The cooling unit of claim 3, wherein the proximity pin is disposed in an insertion groove formed on the seating surface.

7. A substrate treating apparatus comprising:
a housing;
a heating unit positioned within the housing and having a heating plate for heating a substrate; and
a cooling unit for cooling the heating plate and/or the substrate,
wherein the cooling unit comprises:
a cooling plate with a seating surface;
a pin member arranged at the cooling pate and supporting the substrate;
a decompression hole formed on the seating surface;
a decompression path formed within the cooling plate and connected to the decompression hole;
a decompression member for decompressing the decompression path; and
a driving member for moving the cooling plate within the housing, between a position over the heating plate and a position out of the position over the heating plate.

8. The substrate treating apparatus of claim 7, wherein the housing is provided with an opening at a first sidewall for transferring the substrate to and out of the housing, wherein
the heating unit is placed closer to a second sidewall opposing the first sidewall, and
wherein the driving member moves the cooling plate between a first position close to the first sidewall and a second position close to the second sidewall, the second position being the position over the heating plate.

9. The substrate treating apparatus of claim 7, wherein the cooling plate is provided with a cooling path therein.

10. The substrate treating apparatus of claim 7, wherein the pin member comprises:
a proximity pin for supporting the substrate; and
an elastic member connected to the proximity pin.

11. The substrate treating apparatus of claim 10, wherein the elastic member is decompressed by a decompression force by the decompression member and is not constricted by the load of the substrate supported by the proximity pin.

12. The substrate treating apparatus of claim 10, wherein the proximity pin is arranged within an insertion groove formed on the seating surface of the cooling plate.

13. The substrate treating apparatus of claim 8, wherein the heating unit is provided to move vertically within a pinhole formed at the heating plate, and the heating plate further comprises a lift pin for delivering the substrate to the cooling unit.

14. The substrate treating apparatus of claim 13, wherein the cooling plate is provided with a guide hole for delivering the substrate to the heating unit, and when the cooling plate is moved to the second position the lift pin is inserted into the guide hole of the cooling plate to take over and support the substrate, and wherein the guide hole extends outwardly to an edge of the cooling pin.

15. The substrate treating apparatus of claim 7, further comprising a controller, wherein the controller controls the cooling unit such that the cooling plate is placed in contact with or adjacent to the heating plate to cool the cooling plate.

16. The substrate treating apparatus of claim 7, further comprising a controller, and wherein the controller controls the cooling unit such that the substrate is delivered to the cooling plate from the heating plate, then the substrate supported by the cooling plate is cooled, and then a space between the substrate and the seating surface of the cooling pate is decompressed by the decompression member to lower down the substrate toward the seating surface.

17. The substrate treating apparatus of claim 16, wherein the controller further controls the cooling unit such that the substrate is cooled further when the substrate is lowered down toward the seating surface by the decompression member.

* * * * *